(12) United States Patent
Ma et al.

(10) Patent No.: US 10,134,560 B2
(45) Date of Patent: Nov. 20, 2018

(54) MULTI-STAGE/MULTI-CHAMBER ELECTRON-BEAM INSPECTION SYSTEM

(71) Applicant: DONGFANG JINGYUAN ELECTRON LIMITED, Beijing (CN)

(72) Inventors: Weimin Ma, Beijing (CN); Weiqiang Sun, Beijing (CN)

(73) Assignee: Dongfang Jingyuan Electron Limited, Beijing (CN)

( * ) Notice: Subject to any disclaimer, the term of this patent is extended or adjusted under 35 U.S.C. 154(b) by 0 days.

(21) Appl. No.: 15/165,569

(22) Filed: May 26, 2016

(65) Prior Publication Data

US 2017/0301508 A1 Oct. 19, 2017

Related U.S. Application Data

(63) Continuation of application No. PCT/CN2016/079416, filed on Apr. 15, 2016, and a continuation of application No. PCT/CN2016/079414, filed on Apr. 15, 2016.

(51) Int. Cl.
| | |
|---|---|
| *H01J 37/26* | (2006.01) |
| *H01J 37/20* | (2006.01) |
| *H01J 37/28* | (2006.01) |
| *H01J 37/18* | (2006.01) |
| *G03F 1/86* | (2012.01) |
| *G03F 7/20* | (2006.01) |
| *H01L 21/66* | (2006.01) |

(52) U.S. Cl.
CPC ............ *H01J 37/20* (2013.01); *G03F 1/86* (2013.01); *G03F 7/7065* (2013.01); *H01J 37/18* (2013.01); *H01J 37/265* (2013.01); *H01J 37/28* (2013.01); *H01J 2237/063* (2013.01); *H01J 2237/18* (2013.01); *H01J 2237/2002* (2013.01); *H01J 2237/202* (2013.01); *H01J 2237/2007* (2013.01); *H01J 2237/20292* (2013.01); *H01J 2237/24571* (2013.01); *H01J 2237/2817* (2013.01); *H01L 22/12* (2013.01)

(58) Field of Classification Search
CPC .... H01J 2237/2817; H01J 37/20; H01J 37/28; H01J 37/18; H01J 37/265; G01N 23/2206; G01N 23/2208
See application file for complete search history.

(56) References Cited

U.S. PATENT DOCUMENTS

| | | | | |
|---|---|---|---|---|
| 9,466,463 B1* | 10/2016 | Lam | ........................ | H01J 37/28 |
| 2006/0145087 A1* | 7/2006 | Parker | ...................... | H01J 9/42 |
| | | | | 250/396 R |

* cited by examiner

*Primary Examiner* — Eliza Osenbaugh-Stewart
(74) *Attorney, Agent, or Firm* — Joe Zheng

(57) ABSTRACT

Techniques for yield management in semiconductor inspection systems are described. According to one aspect of the present invention, an electron beam inspection system includes multiple stages or multiple chambers, where the chambers/stages (N≥2) are organized to form one or more paths for wafer/mask inspection. An inspection procedure in each chamber (or at each stage) is determined by its order in the path and the relative columns used. For a system with N chambers/stages, a maximum number of N wafers/masks can be processed simultaneously.

20 Claims, 8 Drawing Sheets

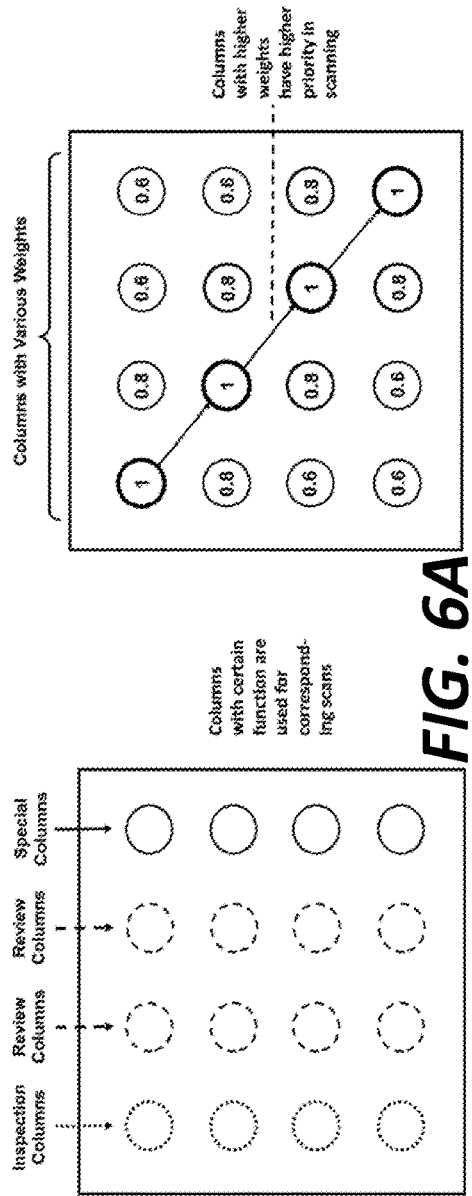
FIG. 6A
FIG. 6B
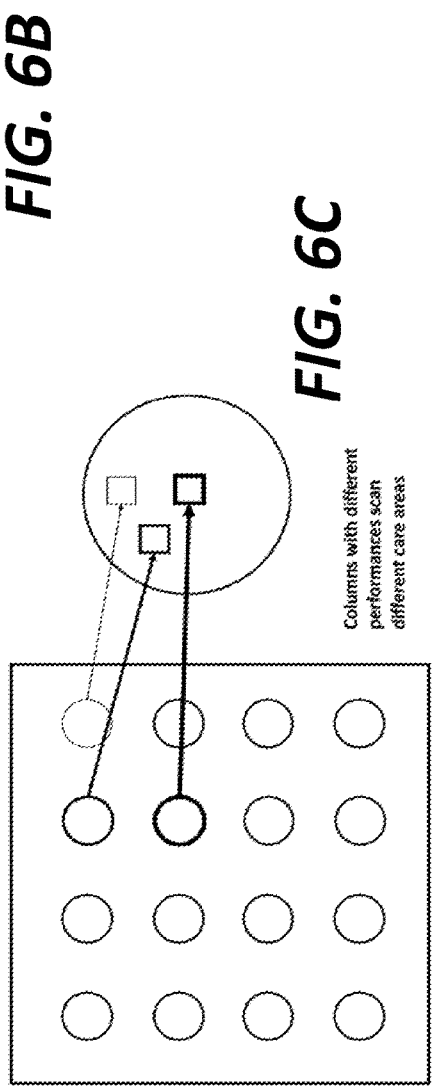
FIG. 6C

MULTI-STAGE/MULTI-CHAMBER ELECTRON-BEAM INSPECTION SYSTEM

BACKGROUND OF THE INVENTION

Field of the Invention

The present invention is related to the area of semiconductor inspection systems, and particularly related to techniques for yield management in semiconductor inspection systems. More particularly, an electron beam inspection system includes multiple stages or multiple chambers, where the chambers/stages (N≥2) are organized to form one or more paths for wafer/mask inspection. An inspection procedure in each chamber (or at each stage) is determined by its order in the path and the relative columns used. For a system with N chambers/stages, a maximum number of N wafers/masks can be processed simultaneously.

Description of the Related Art

Inspection systems help semiconductor manufacturers increase and maintain integrated circuit (IC) chip yields. Semiconductor manufacturers buy the inspection systems at a rate of close to US$1B per year. This capital investment attests to the value of the inspection systems in manufacturing IC chips. The IC industry employs the inspection systems to detect various defects that may have occurred during the manufacturing process. One of the purposes provided the inspection system is to monitor whether the manufacturing process is under control. If it is not, the system could help indicate the source of the problem. The important characteristics of an inspection system are defect detection sensitivity and throughput. The sensitivity and throughput are often related, as in general greater sensitivity usually means lower throughput.

Evolution of the semiconductor manufacturing industry is placing ever greater demands on yield management and in particular, on metrology and inspection systems. Critical dimensions are continuously shrinking while wafer size is increasing from 200 mm to 300 mm or possibly more in the future. Economics is driving the industry to decrease the time for achieving high-yield, high-value production. Thus, minimizing the total time from detecting a yield problem to fixing it determines the return-on-investment for the semiconductor manufacturers.

Thus there is a great need for methodologies or inspection systems that are adaptive enough to provide the most efficient yield management.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In general, the present invention is related to techniques for yield management in semiconductor inspection systems. According to one aspect of the present invention, an electron beam inspection system includes multiple stages or multiple chambers, where the chambers/stages (N≥2) are organized to form one or more paths for wafer/mask inspection. An inspection procedure in each chamber (or at each stage) is determined by its order in the path and the relative columns used. For a system with N chambers/stages, a maximum number of N wafers/masks can be processed simultaneously.

According to another aspect of the present invention, the assignment of the functions of the chambers/stages follows a methodology to maximize the total throughput. The wafer/mask is then inspected or reviewed in different chambers (or at different stages) for the features of certain types and care areas, and transferred according to the order of the pipeline.

According to still another aspect of the present invention, at least one of the chambers or stages includes an assembly that may typically comprise a plurality of individual columns (e.g., 50-200), each column has an individual electron beam, hence a multicolumn electron-beam inspection system. The columns are allocated by their function, weight, and performance. The columns of certain function (e.g., inspection, review) are used for certain type of scanning, and the columns with different performances (e.g., spot size) are assigned for different jobs or care areas accordingly.

The present invention may be implemented as a method, a system, an apparatus or a part of a system, different implementations yield different benefits, advantages and objectives. According to one embodiment, the present invention is a semiconductor inspection system comprising: a controller, a first inspection station positioned to receive a semiconductor sample for a first type of inspection therein, and at least two second inspection stations, each of the at least two second inspection stations configured to conduct a second type of inspection, wherein the controller executes a control module configured to determine a second inspection station from the at least two second inspection stations when the semiconductor sample is done with the first type of inspection, the second inspection station is so determined that a time gap between the first station and the second station is minimum and inspection precisions are gradually increased.

According to one embodiment, the present invention is a semiconductor inspection system comprising: a controller; a first group of inspection stations, each of the first group of inspection stations configured to conduct a first type of inspection; a second group of inspection stations, each of the second group of inspection stations configured to conduct a second type of inspection. The first type of inspection is to detect a defect larger than a predefined size limit on a sample and the second type of inspection is to detect a defect smaller than the predefined size limit on a sample. A control module is executed in the controller and configured to determine one of the second group of inspection stations that is not occupied to take in an inspected item from one of the first group of inspection stations without causing a delay due to an occupied one of the second group of inspection stations when moving the inspected item from one inspection station to another.

Other objects, features, benefits and advantages, together with the foregoing, are attained in the exercise of the invention in the following description and resulting in the embodiment illustrated in the accompanying drawings.

BRIEF DESCRIPTION OF THE DRAWINGS

These and other features, aspects, and advantages of the present invention will become better understood with regard to the following description, appended claims, and accompanying drawings where:

FIG. 6A shows a section of exemplary columns, not all columns are used equally, where the columns are assigned with different functions;

FIG. 6B shows another section of exemplary columns, where columns with higher weights have higher priority in scanning;

FIG. 6C shows that columns with different performance scan different areas; and

DETAILED DESCRIPTION OF THE PREFERRED EMBODIMENTS

The detailed description of the present invention is presented largely in terms of procedures, steps, logic blocks, processing, or other symbolic representations that directly or indirectly resemble the operations of inspection instruments or devices. These descriptions and representations are typically used by those skilled in the art to most effectively convey the substance of their work to others skilled in the art. Numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Figure 1:
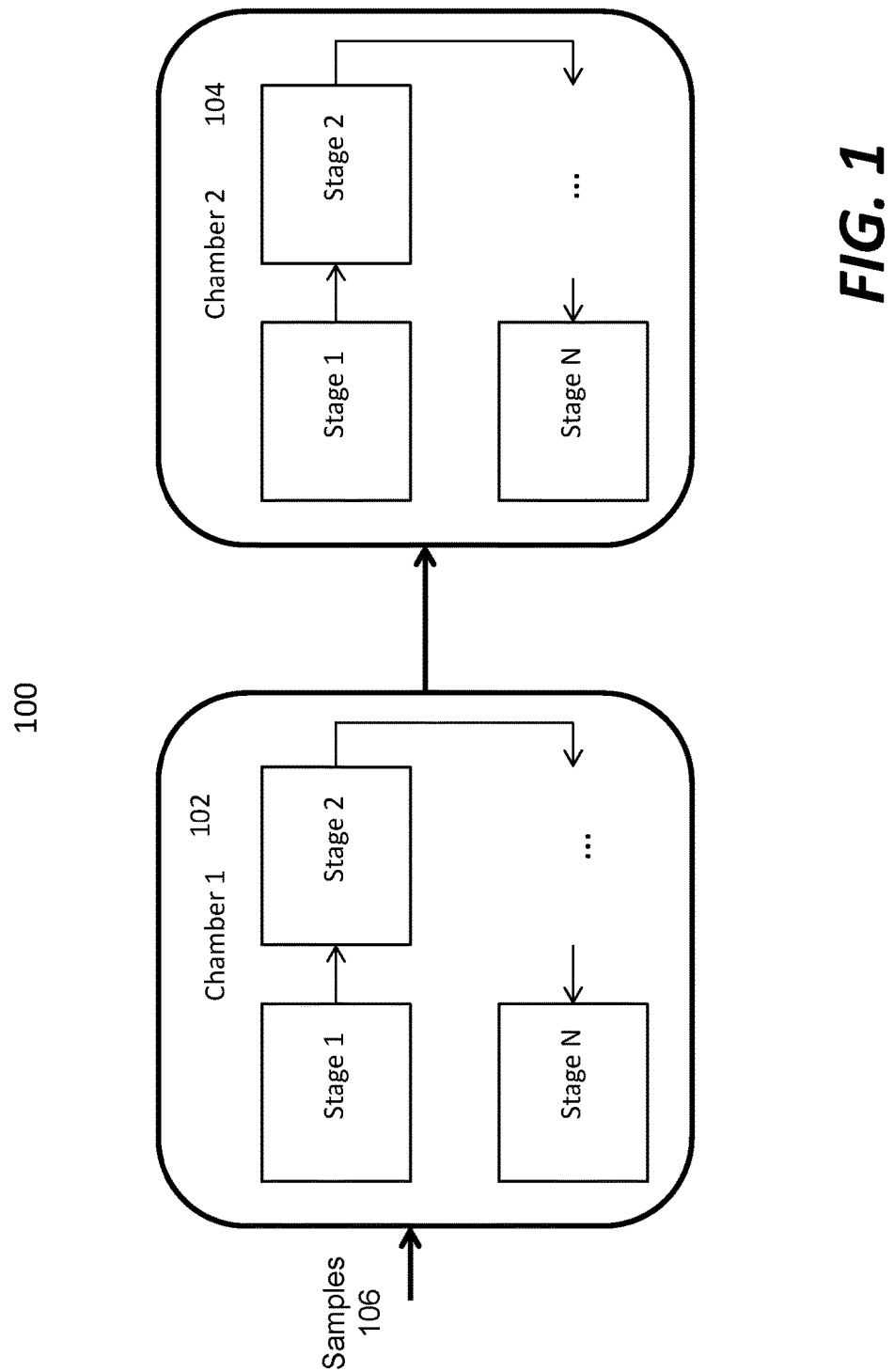
FIG. 1 shows an exemplary inspection system in which the present invention may be applied to significantly improve the throughput without sacrificing the sensitivity or performance thereof.

Referring now to the drawings, in which like numerals refer to like parts throughout the several views, FIG. 1 shows an exemplary inspection system 100 in which the present invention may be applied to significantly improve the throughput without sacrificing the sensitivity or performance thereof. The exemplary system 100 is shown to include a chamber 102 and a chamber 104, each of the chambers 102 and 104 is shown to have N stages, where N is an integer and at least one. Traditionally, items to be inspected or samples 106 (e.g., wafers or masks) are routed into the chamber 102, each of the samples 106 go through each of the stages therein for predefined inspections. Those samples that have passed the chamber 102 are now to go through the chamber 104, where additional inspections are to be conducted thereon. It can be observed that the throughput of the system 100 is essentially controlled by the number of the stages in a chamber together with the test procedures at each of the stages. Given the linear arrangement of the stages or chambers, the more chambers/stages there are in an inspection system, the lower the throughput for the system.

In reality, not all samples have to go through each of the stages in a chamber or all the chambers, if there are any. Further it is much more efficient to carry out a serial of inspections over several stages rather than completing a comprehensive inspection at one stage. One of the benefits, advantages and objectives in one embodiment of the present invention is to enhance the throughput by dynamically routing a sample (e.g., wafer/mask) from one station to another. Unless explicitly stated, as used herein, a station means a stage or a chamber. As the name suggests, a stage is a set of test procedures to be performed on a sample for a designated inspection while a chamber is relatively standalone. In one embodiment, a chamber is designed to carry out a set of particular inspections to detect if there are one or more particular defects on a sample received in the chamber. In other words, a chamber may include several stages while an inspection instrument includes at least one chamber.

According to one embodiment, a stage is a platform that holds a sample and has a mechanism to move in a direction so that the sample may be inspected (e.g., by an electron beam microscope). A stage must be situated inside a chamber. A chamber is a vacuum chamber that holds one or more stages.

Figure 2A:
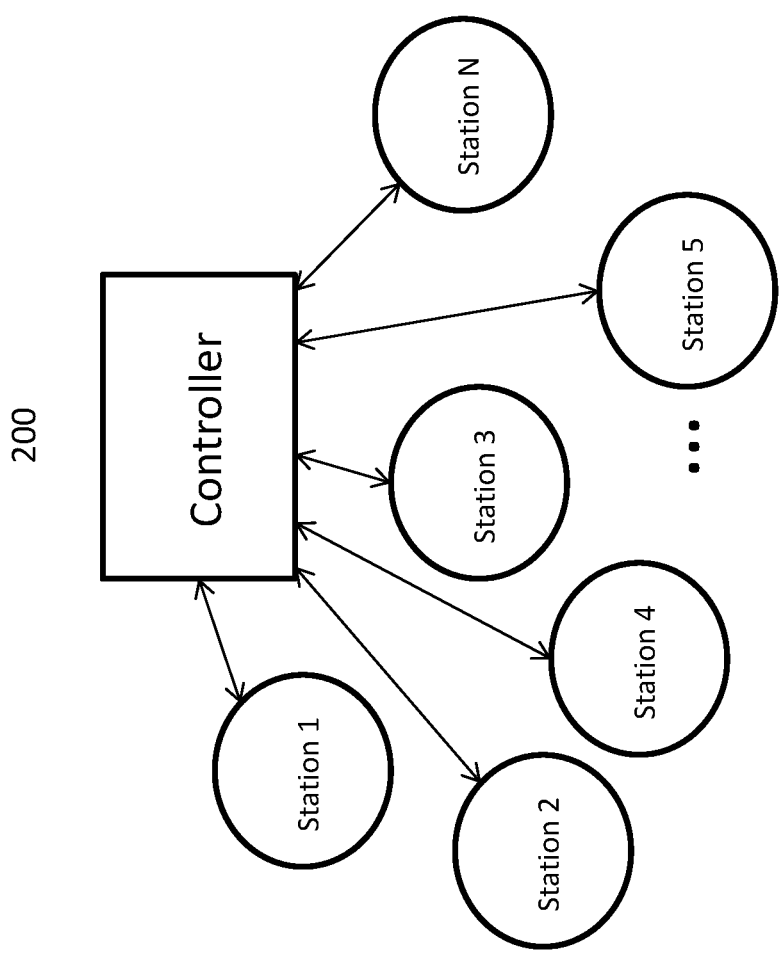
FIG. 2A, it shows a conceptual diagram of a controller programmed or caused to control N stations, where N is at least two (2)

Referring now to FIG. 2A, it shows a conceptual diagram of a controller 200 programed or caused to control N stations, where N is at least two (2). Depending on implementation, the controller 200 may be part of an inspection instrument or a computing device provided to control the operation of these stations. According to one embodiment, test items or samples are not sequentially set to go through each of these stations. Instead, depending on the test result from a station, the controller is designed to route a sample to a next station deemed most appropriate without delay to carry out a next inspection task on the sample. According to another embodiment, some of the stations are duplicated to improve the throughput, which means each of the duplicated stations performs an identical task. For example, a certain task at a station takes a longer time to finish than tasks at other stations. Instead of waiting for a station to complete a designated task, the duplicated stations thereof can be used to start the task on other test samples, hence minimizing a time gap between two adjacent stations.

Figure 2B:
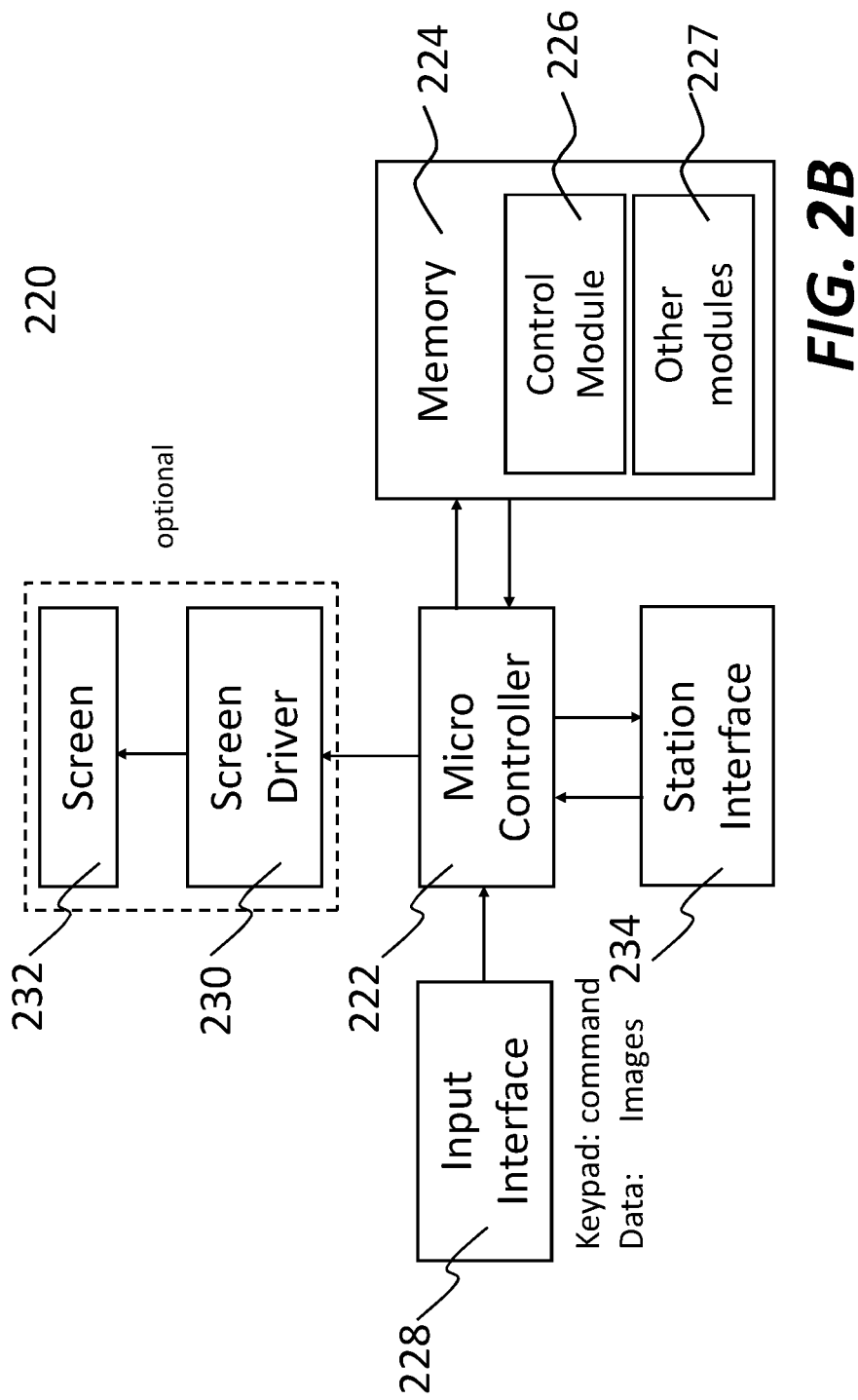
FIG. 2B illustrates an internal functional block diagram of a computing device that may be used as the controller in FIG. 2A.

Referring now to FIG. 2B, it illustrates an internal functional block diagram 220 of a computing device that may be used as the controller in FIG. 2A. The computing device includes a microprocessor or microcontroller 222, a memory space 224 (e.g., RAM or flash memory) in which there is a control module 226, an input interface 228, a screen driver 230 to drive a display screen 232 and a station interface 234. According to one embodiment, the control module 226 is implemented to realize one embodiment of the present invention. Depending on implementation, the control module 226 may be loaded into the memory space 224 via an interface (e.g., a storage medium or a data network). When the control module 226 is executed by the microcontroller 222, a plurality of (test) stations can be effectively controlled and test samples can be seamlessly routed among the stations to carry out necessary inspection tasks so as to enhance the throughput without scarifying the performance of the inspection system.

The input interface 228 includes one or more input mechanisms. A user may use an input mechanism to interact with the device 220 by entering a command. In the context of the present invention, the input interface 228 receives test signals (e.g., scanning signals at preset resolutions), the microcontroller 222 is caused to perform processing and analysis of the test signals. Based on the results from the test signals, the microcontroller 222 executing the control module 226 controls which station is called upon to carry out a next inspection task.

The driver 230, coupled to the microcontroller 222, is provided to take instructions therefrom to drive the display screen 232. In one embodiment, the driver 230 is caused to drive the display screen 232 to display a test result of a sample, for example, an indication of pass or fail of the sample. In one embodiment, the display screen 232 is caused to display which station is the next for a sample being inspected with a set of parameters to show the pass or fail of the sample from a previous station. The display screen 232 allows an operator (e.g., a fab manager) to assess the current status of the manufacturing process. The network interface 234 is provided to allow the device 220 to communicate with or control all the stations via a designated medium (e.g., a data bus or network).

According to one implementation, the control module 226 is loaded in the memory 224 and executed by the controller 222 to reconfigure the columns in a multicolumn electron-beam inspection tool used in at least one of the stations. Instead of uniformly using all the columns, the columns of a system are allocated by the control module 226 by their functions, weights, and/or performances. More importantly, based on test results from a previous station, the columns are allocated effectively for a particular sample or a particular area thereof to reduce the time or/and inspection effort or details spent by the columns on the sample or the area thereof. As a result, the overall throughput for the station is considerably enhanced to make it possible for use in-line in a semiconductor fabrication facility.

Figures 3A, 3B:
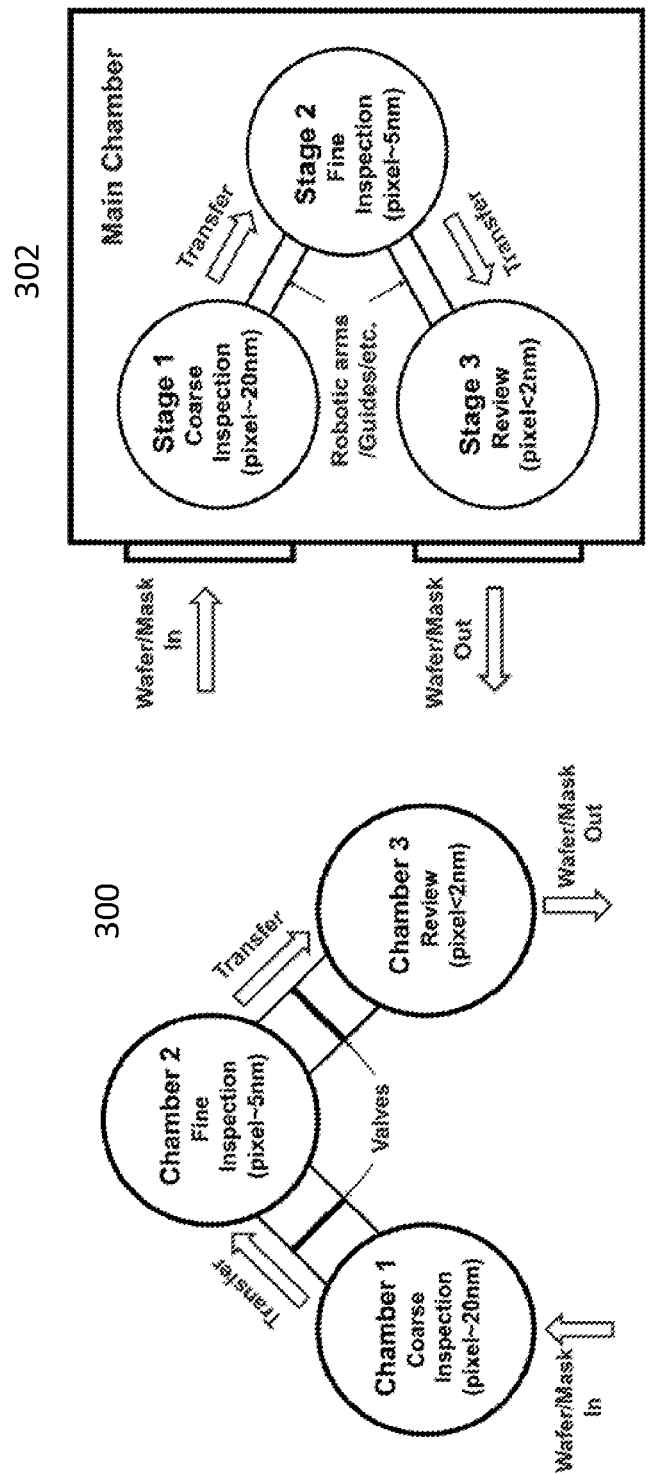
FIG. 3A shows a wafer/mask being inspected or routed from chamber 1 to chamber 3 with increasing inspection precision, where three chambers are arranged in a linear path.
FIG. 3B shows a chamber with three stages arranged in a linear path.

FIG. 3A shows an exemplary flow 300 of three chambers being organized to form one or more paths for wafer/mask inspection. The inspection procedure in each chamber is determined by its order in the path and the relative columns used. The assignment of the functions of the chambers follows a methodology to maximize the total throughput. The wafer/mask is then inspected or reviewed in different chambers for the features of certain types and care areas, and transferred according to the order of the pipeline. For a system with N chambers, a maximum number of N wafers can be processed simultaneously.

Various modes of inspection, which are mainly categorized into linear-path or multi-path by the pipeline, can be arranged flexibly. For the linear-path inspection, such as in the three-chamber system, the wafer/mask is inspected in the chambers in a serial order. The first chamber is used to perform a coarse inspection (e.g., pixel size around 20 nm). The second chamber is used to perform a fine inspection (e.g., pixel size around 5 nm), and the third chamber is used to perform defects review (e.g., pixel size less than 2 nm). The wafer/mask is then inspected or routed from chamber 1 to chamber 3 with increasing inspection precision as shown in FIG. 3A. Those skilled in the art can appreciate that the linear-path inspection as shown in FIG. 3A is designed to increase the throughput. For example, if a sample is inspected with a system including one chamber and one stage, the total inspection time is assumed T. For a system with one chamber including three parallel stages, the average time at each stage is roughly assumed T/3. But the total inspection would be larger than T when the transfer time is taken into account, e.g., 1.2T. However, when the sample is moved to one of three stages, one of the remaining two staged can inspect a next sample, and a third sample can be followed on the remaining stage, making the inspection procedures of the three samples almost in parallel. Thus a sample can be finished with this system about every 0.4T. For a whole period of 60T, a one-stage-one-chamber system would finish 60 samples while a one-chamber-three-stage system according to FIG. 3A could finish more than 150 samples (less than 180 samples since the first/last sample does not have sample before/after it). As a result, the throughput is greatly increased.

FIG. 3B shows a chamber with three stages arranged in a linear path. Similar to FIG. 3A, each of the three stages is set for inspecting a series of samples for defects within a limit. The sample is first inspected with a normal inspection sensitivity (a larger pixel size), and a wider area. If no defect is found, the sample is unloaded for quick throughput. If, however, defects or possible defects are found, the sample is loaded to the next stage and inspected with a higher sensitivity (a smaller pixel size) so that the defects are studied to figure out the issues with the manufacturing process. The inspection with the higher sensitivity is conducted in a much smaller, targeted area so that the throughput is not negatively affected. As a result, the overall throughput of the three stages can be enhanced.

Figures 4A, 4B:
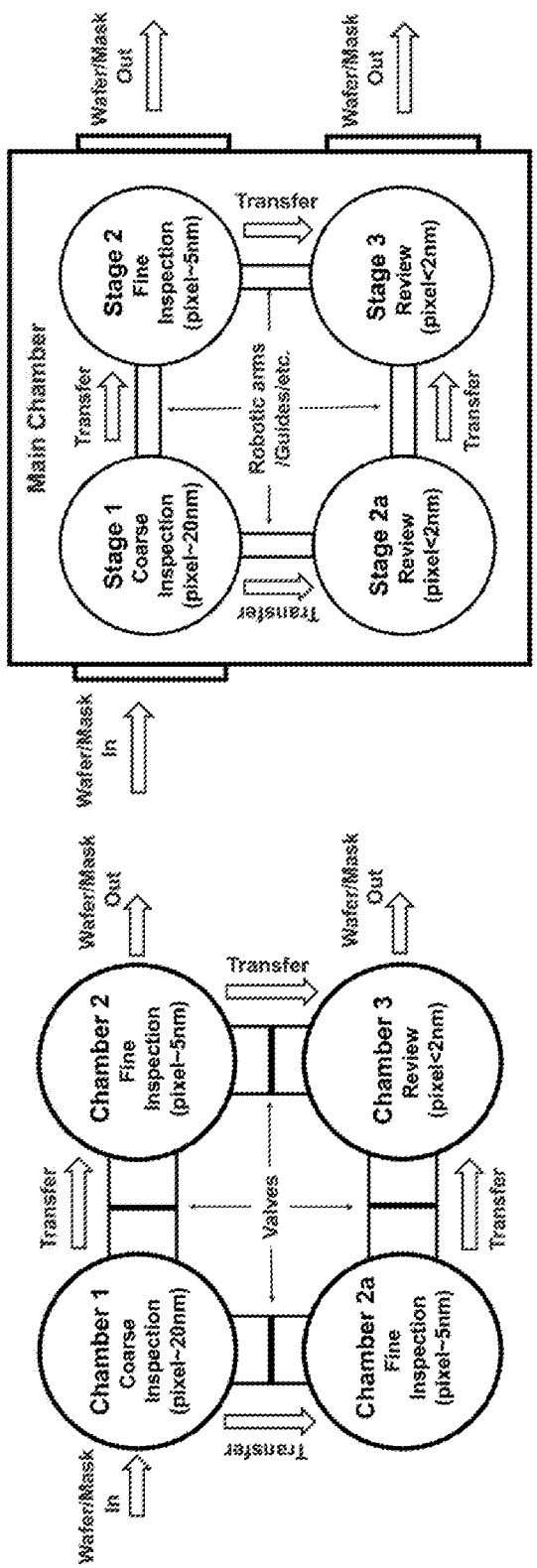
FIG. 4A and FIG. 4B show another embodiment in which four chambers/stages are arranged in a system to provide multiple paths to enhance the throughput of the inspection system.

With more chambers/stages, the transfer connections can be set up and arranged more flexibly, giving more flexibility to the inspection arrangement and scheduling. For example, FIG. 4A and FIG. 4B show the schematics of another embodiment of this invention, where four chambers/stages are configured in a system. The first chamber/stage (for coarse inspection) is connected to two chambers/stages (namely Chamber/Stage 2 and 2a, for inspection with pixel size around 5 nm). When the coarse inspection in chamber 1/stage 1 is done, the control (i.e., the control module 226) is configured to decide in which chamber/stage the next fine inspection should take place. If one of chamber/stage 2 or 2a is busy, then the sample should logically be sent to the other, therefore greatly reducing the chance of "traffic jam" of the inspection work flow. The wafer/mask can be inspected in Chamber/Stage 2 or 2a after Chamber/Stage 1 inspection, and later be transferred to Chamber/Stage 3 for review. Chamber 2 and Chamber 3 each is connected to an output port, where Chamber 2 exits those samples that have no need for review in Chamber/Stage 3. Thus, the multiple paths include: 1→2→3, 1→2a→3, and 1→2.

Given the description above, those skilled in the art can easily understand how more chambers/stages in an inspection system can be configured to route a sample without causing a traffic jam. It can also be understood that the multi-path configuration increases the flexibility in scheduling the inspection tasks and increases the efficiency of the entire inspection process. The configuration ensures that a potential blockade at some spots along the inspection line would not block the whole processing.

For systems with N chambers/stages, a preferred setting is to assign the chambers/stages with different inspection steps orderly when N is small (e.g., 2-3). The chambers/stages close to the input ports are labeled with lower order while those close to the output ports have higher order. Chambers/ stages with higher order are usually assigned with finer inspection task. The path of wafer/mask transfer is then determined by the order. When the inspection for one wafer/mask in the $i^{th}$ chamber (or at the $i^{th}$ stage) is finished, the wafer/mask is moved to the next $(i+1^{th})$ chamber/stage for next-step inspection (usually with finer resolution) if the inspection of the wafer/mask in the next $(i+1^{th})$ chamber/stage has also been completed. If the next $(i+1^{th})$ chamber/stage is still occupied, then the current wafer/mask will stand by until the next chamber/stage is ready. Up to N wafers/masks can be inspected simultaneously.

If N is larger (≥4), multiple paths is created and the order of the chambers/stages is configured flexibly. A chamber/stage (order $i^{th}$) can be connected to two or more chambers/stages (with same order or different order), thus wafers/masks can be set to follow different paths for different types of inspection. The setting can be modified if needed. It is possible to change the order of the chambers/stages or switch between different paths (e.g., from linear path to multi-path or reversed). By combining with various multi-columns, more specific inspection needs can be satisfied.

Figure 5:
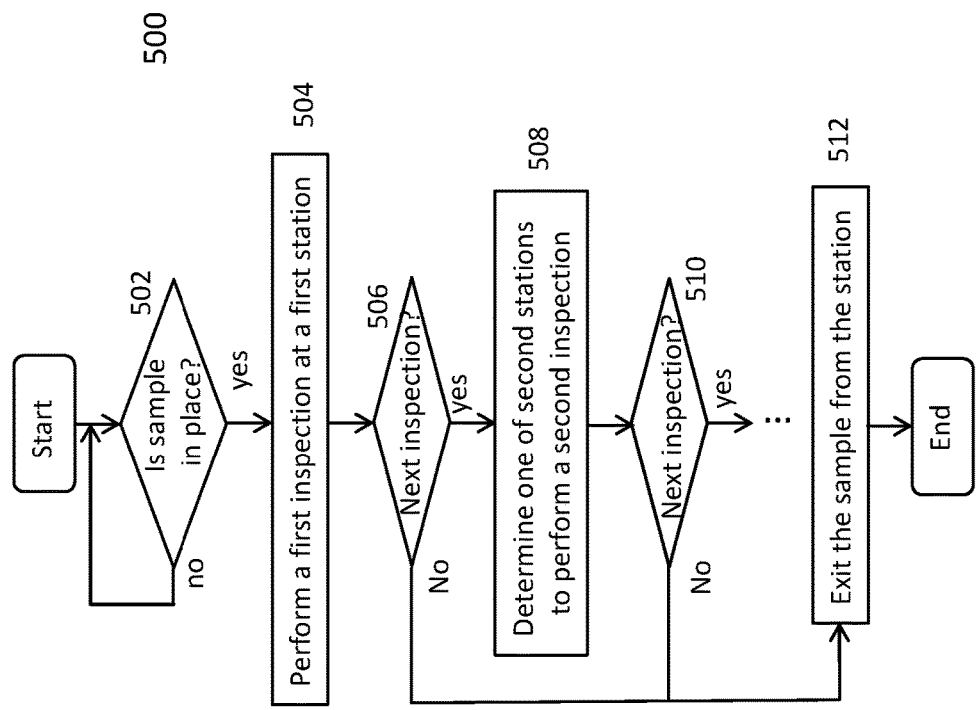
FIG. 5 shows a flowchart or process of conducting an inspection of a sample along a multi-path.

Referring now to FIG. 5, it shows a flowchart or process 500 of conducting an inspection of a sample along a multi-path. The process 500 may be implemented in software as a module or in combination with software and hardware. To facilitate the description of the process 500, the previous drawings shall be referred to.

According to one embodiment, a plurality of samples are moved along a moving mechanism (e.g., a convey belt or a mechanical arm) through a set of stations. The process 500 starts when one of the samples is moved into a station that is set to conduct one type of inspection. At 502, the station, also referred to as first station, is caused to examine if the sample is in place. For example, a wafer is moved onto a platform in the station, a camera is used to check if the sample is in place for inspection. In operation, an image from the camera is sent back to a module (e.g., the control module 226 of FIG. 2B). After the image is processed, a decision can be inferred whether the sample is in place or not. If not, the sample can be repositioned. Once it is determined that the sample is in place, the process 500 moves to 504 to conduct the type of inspection specifically at the station. According to one embodiment, the first station is designed to conduct an inspection with larger pixel size (e.g., 20 nm) and to inspect a wider area. When the first inspection is finished, the process 500 moves to 506 to determine if further inspection is needed. If there would be no need to conduct further inspection, the sample will be unloaded from the system. If it is determined further inspection is warranted, the process 500 goes to 508 to determine which one of the next (second) stations available to conduct another type of inspection on the sample. According to one embodiment, the second station is designed to conduct an inspection with smaller pixel size (e.g., 5 nm).

As described above, there are more than one second stations. The control module 226 of FIG. 2B is configured to minimize any time duration between two stations by determining an immediately available second station to take in the sample. In operation, the sample existing from the first station and automatically routed to the chosen second station is conducted the second type of inspection. The process 500 comes to 510 to determine whether the sample needs to be reviewed, based on the results of the inspection result. If it is determined the sample needs to be reviewed, it will be again routed to a next (third) station to have a review inspection thereon, otherwise, the sample will be unloaded from the system.

The process 500 is described above with respect to two levels of test stations (e.g., stages or chambers). It can be appreciated by those skilled in the art that the process 500 is applicable to several levels of stations, and for a system with N stations, a maximum number of N samples can be processed simultaneously.

A station (i.e., stage or chamber) may employ various technologies to detect possible defects on a sample. According to one embodiment of the present invention, at least one station employs a multicolumn electron beam or e-beam tool for the detection of electrical defects that may be present in the sample. Within an electron optical column, the electron beam is generated under vacuum, focused to a small diameter, and scanned across the surface of a specimen by electromagnetic deflection coils. By using multiple columns, a sample can be simultaneously imaged (e.g., by electron detectors or other imagers) by more than one column usually (maybe all of the columns in the best case), significantly increasing the throughput of the inspection.

In one embodiment of the present invention, there are roughly 200 columns distributed over a 300 mm diameter wafer. Each column covers a footprint of 20×20 mm in size over the wafer. In another embodiment of the present invention, this column footprint can be 40×40 mm, corresponding to approximately 56 columns over a 300 mm diameter wafer.

The configurations of columns in a prior art multicolumn electron-beam inspection systems set each column with same function and equal priority. The care areas or areas of interest on wafers, however, may not be located in a way that guarantees all of the care areas are covered or that the columns are used most effectively, thus resulting in low efficiency in scanning. According to one embodiment, the columns of a system are allocated by their functions, weights, and performances. The columns of certain function (e.g. inspection, review) are used for certain type of scanning, and the columns with different performances (e.g., spot size) are assigned for different jobs or care areas accordingly.

According to one embodiment, there are three basic modes of allocation and control of the columns:

1. By function: Columns are divided into groups with different functions, for example, inspection and review. The columns with different functions work in time order as controlled;
2. By weight: Columns are set with different weight values, the columns with higher weight are primarily used in scanning; and
3. By performance: Columns with different performance are assigned with different scanning jobs or for different care areas.

For various patterns or care areas, combination of these modes can be applied flexibly by following certain rules and algorithms.

Referring now to FIG. 6A, it shows that a section of exemplary columns, not all columns are used equally. As shown in FIG. 6A, one group of columns are chosen to carry out a certain inspection, e.g., coarse inspection, while another group of columns are used for subsequent inspection, e.g., fine inspection. In one embodiment, after a wafer is inspected, a review process is applied to the wafer in order to further analyze and classify defects. Sometimes, only certain critical areas of the sample need to be inspected. In this case, the critical areas can be collectively inspected by using a customized, or calculated inspection path so that all of the critical regions will be covered by either of the chosen columns in an optimal way, such as with the shortest travel distance, or fastest inspection speed.

FIG. 6B shows that another section of exemplary columns, where columns with higher weights have higher priority in scanning. FIG. 6C shows that columns with different performance scan different areas. For various patterns or care areas, combination of these modes can be applied flexibly by following certain rules and algorithms. For example, an optimization problem can be formed, given the care area locations and tasks on a sample, the configurations of the columns (the function, the weight, and the performance) and the cost factors of various actions of the e-beam tool, to minimize the distance a stage must travel to cover all the care areas, or set the functions in a specific order. In one embodiment, the inspections can be carried out in increasing precisions. The purpose is to minimize the time that would have to spend on inspecting the sample.

The weight value of a column can be determined by their location, performance or other factors, and the columns with higher weights share higher priority in scanning. Scanning jobs can then be assigned by the function, weight, and performance of the columns, or by some certain combination of these factors (following certain algorithms).

Figure 7:
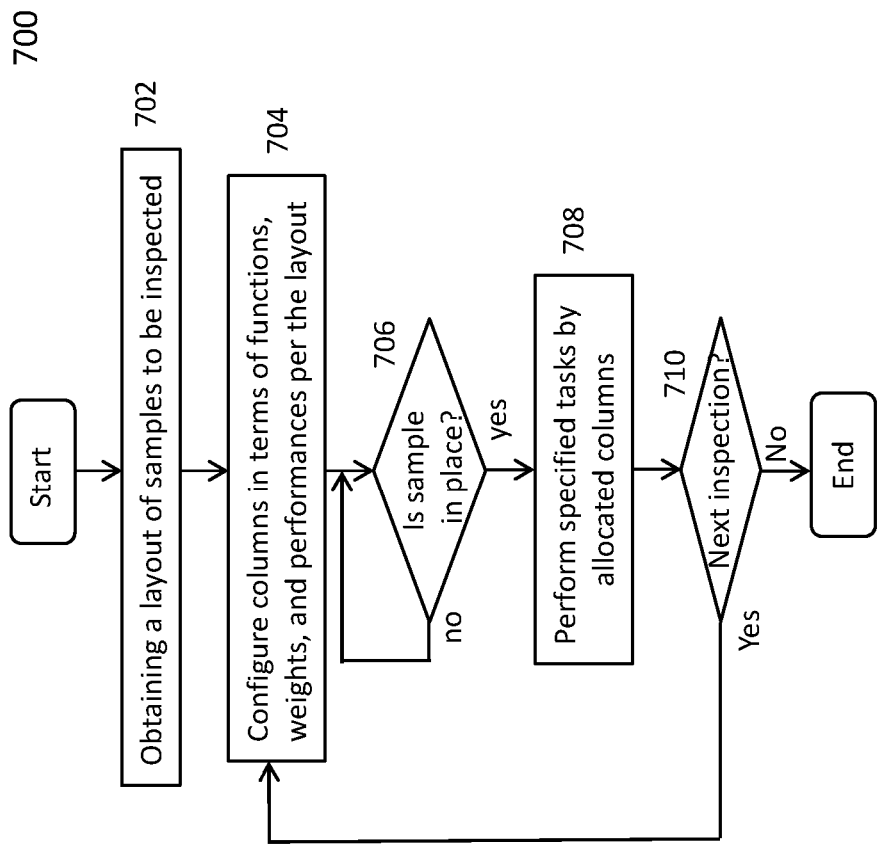
FIG. 7 shows a flowchart or process of assigning columns with different functions.

Referring now to FIG. 7, it shows a flowchart or process 700 of configuring columns based on three factors: function, weight, and performance. The process 700 may be implemented in software as a module or in combination with software and hardware. To facilitate the description of the process 700, the previous drawings shall be referred to.

According to one embodiment, a plurality of samples is moved along a moving mechanism (e.g., a convey belt or a mechanical arm) through a set of stations. To effectively use the columns of inspection tools or sensors (e.g., e-beams) at a station, at 702, the layout of the samples are accessed. In operation, the layout of the samples is analyzed to determine which area of a sample needs what sensors to sense or review, and often at what resolutions. The purpose is to minimize the time needed for various inspections of the sample.

The process 700 moves to 704 to configure the columns per the layout obtained the 702. FIG. 6A, FIG. 6B and FIG. 6C are some examples that the columns may be configured therefor. At 706, when one of the samples is moved into a station that is set for inspection by the columns. One of the columns or other sensors are provided to ensure that the sample is positioned correctly for the inspection. Once the sample is ensured that it is right in the position, the inspection proceeds as specified at 708.

As described above, the columns configured in accordance with 704 are placed to perform their respective tasks. Depending on the configuration, some do scanning, some do reviewing and analysis while others may look at different areas of the sample at same or different resolutions. Optionally, the process 700 move to 710, where the columns at the same station may be configured in time to change with different functions, weights or performance for a different type of inspection.

Those skilled in the art that the present invention leads to higher average usage rate, shorter scanning time, thus higher efficiency, which translates to higher throughput, for any multicolumn electron-beam inspection system.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A semiconductor inspection system comprising:
a controller;
a memory, coupled to the controller, for storing a control module, executed by the controller;
a first inspection station, equipped with e-beam generators arranged in columns, positioned to receive a semiconductor sample for a first type and a second type of inspection with electron beams respectively from the e-beam generators, wherein the electron beams are calibrated in groups to inspect the semiconductor sample in different precisions, a partial area of the semiconductor sample is only inspected by a group of the electron beams in fine precision when the partial area of the semiconductor sample has passed an inspection by a group of the electron beams in coarse precision, the first type of inspection is to inspect the semiconductor sample with a predefined pixel size, the second type of inspections is to inspect the semiconductor sample with a smaller than the predefined pixel size; and
at least two second inspection stations, wherein the controller is caused to execute the control module to determine a second inspection station from the at least two second inspection stations when the semiconductor sample is done with the first and the second types of inspection in the first inspection station, so that a time gap between the first station and the second station is minimized while inspection precisions in the first station are gradually increased.

2. The inspection system as recited in claim 1, wherein the control module receives a result of the second type of inspection on the semiconductor sample from the first inspection station, and determines which one of the at least second inspection stations for the semiconductor sample to be transferred thereto based on the result.

3. The inspection system as recited in claim 2, wherein the control module causes the semiconductor sample to be pushed out from further inspection when the area of the semiconductor sample has failed the inspection by the group of the electron beams in coarse precision.

4. The inspection system as recited in claim 3, wherein the semiconductor inspection system includes a total of N inspection stations including the first inspection station and the at least two second inspection stations, a maximum number of N semiconductor samples are processed simultaneously in the semiconductor inspection system.

5. The inspection system as recited in claim 4, wherein the semiconductor sample is a wafer or a mask.

6. The inspection system as recited in claim 1, wherein the groups of the electron beams are respectively allocated with different weights and functions, a particular area of the semiconductor sample is scanned by a group of the electron beams prior to another group of the electron beams based on assigned corresponding weights and functions thereof.

7. The inspection system as recited in claim 6, wherein the groups of electron beams are working in time order as controlled by the controller.

8. The inspection system as recited in claim 6, wherein the groups of electron beams with higher weights are firstly used in scanning a designated area of the semiconductor sample.

9. The inspection system as recited in claim 6, wherein the groups of electron beams are assigned with different scanning jobs or for different areas of the semiconductor sample.

10. The inspection system as recited in claim 1, wherein each of the first inspection station and the at least two second inspection stations is a chamber including at least one stage, the at least one stage being configured to conduct one type of inspection with a particular pixel size.

11. The inspection system as recited in claim 1, further comprising a chamber including a plurality of stages, each of the stages being configured to conduct one type of inspection, wherein each of the first inspection station and the at least two second inspection stations is one of the stages.

12. A semiconductor inspection system comprising:
a controller;
a first group of inspection stations, equipped with e-beam generators arranged in columns, positioned to receive a plurality of semiconductor samples for a first type and a second type of inspections with electron beams respectively from the e-beam generators, wherein the electron beams are calibrated in groups to inspect the semiconductor samples in different precisions, a partial area of one semiconductor sample is only inspected by a group of the electron beams in fine precision when the partial area of the semiconductor sample has passed an inspection by a group of the electron beams in coarse precision;
a second group of inspection stations; and
wherein the first type of inspections is to inspect the semiconductor sample with a predefined pixel size, the second type of inspections is to inspect the semiconductor sample with a smaller than the predefined pixel size, and a control module is executed in the controller to determine one of the second group of inspection stations that is not currently occupied to take in an inspected item from one of the first group of inspection stations without causing any delay when moving the inspected item from one inspection station to another, the first type of inspections and the second of inspections are pertaining to scanning the semiconductor sample but for different purposes.

13. The inspection system as recited in claim 12, wherein the semiconductor inspection system includes a total of N inspection stations including the first and second groups of inspection stations, a maximum number of N items being processed simultaneously in the semiconductor inspection system.

14. The inspection system as recited in claim 13, wherein each of the items is a wafer or a mask.

15. The inspection system as recited in claim 13, wherein the groups of the electron beams are respectively allocated with different weights and functions, a particular area of the semiconductor sample is scanned by a group of the electron beams prior to another group of the electron beams based on assigned corresponding weights and functions thereof.

16. The inspection system as recited in claim 15, wherein the groups of the electron beams with different functions are working in time order as controlled by the controller.

17. The inspection system as recited in claim 15, wherein the groups of electron beams with higher weight values are firstly used in scanning a particular area of the semiconductor sample.

18. The inspection system as recited in claim 15, wherein the groups of electron beams are assigned with different scanning jobs or for different areas of the semiconductor sample.

19. The inspection system as recited in claim 12, wherein each of the first and second groups of inspection stations is a chamber including a plurality of stages, each of the stages being configured to conduct one type of inspection with a particular pixel size.

20. The inspection system as recited in claim 12, further comprising a chamber including a plurality of stages, each of the stages being configured to conduct one type of inspection with a particular pixel size, wherein each of the first and second groups of inspection stations is one of the stages.

* * * * *